United States Patent [19]

Garvey

[11] Patent Number: 4,499,433
[45] Date of Patent: Feb. 12, 1985

[54] AUTOLOCK FOR RESONATORS FOR FREQUENCY STANDARDS

[75] Inventor: Robert M. Garvey, Swampscott, Mass.

[73] Assignee: Frequency and Time Systems, Inc., Beverly, Mass.

[21] Appl. No.: 289,069

[22] Filed: Jul. 31, 1981

[51] Int. Cl.³ ............................................. H03L 7/26
[52] U.S. Cl. ...................................... 331/3; 331/94.1
[58] Field of Search ............... 331/94.1, 3; 324/103 P, 324/103 R, 77 A

[56] References Cited

U.S. PATENT DOCUMENTS 4,331,933  5/1982  Allan et al. ......................... 331/94.1

OTHER PUBLICATIONS

Arditi et al., "Atomic Clock Using Microwave Pulse-Coherent Techniques", IEEE Transactions on Instrumentation and Measurement, Jun.–Sep. 1964, pp. 146-152.

"A Cesium Beam Frequency Reference For Severe Environments", by Heger et al.—Hewlett—Packard Journal, Mar. 1976, vol. 27, No. 7, pp. 2-10.

Primary Examiner—Siegfried H. Grimm
Attorney, Agent, or Firm—Peter L. Berger

[57] ABSTRACT

A system is disclosed for examining the response in atomic and molecular resonators to identify and select the maximum resonant peak and the voltage used to cause said peak to be produced. The system is fabricated of modular elements electrically connected to a circuit board to facilitate its construction and transportation with the resonator. A microprocessor is utilized to perform the analysis and to generate information to select the maximum resonant peak, and the system includes means to compare the value of successively generated resonator outputs and to select the output with the maximum peak.

16 Claims, 3 Drawing Figures

AUTOLOCK FOR RESONATORS FOR FREQUENCY STANDARDS

BACKGROUND OF THE INVENTION

This invention relates to atomic and molecular resonator apparatus, and more particularly, to a system which quickly, accurately and automatically finds and identifies the desired resonant peak in the response of a resonator apparatus.

Atomic and molecular resonators are basic frequency determining elements in stable frequency standards. They are widely used and both rely upon the predicted frequency of state transitions to serve as a standard.

Although the following discussion describes the operation of a cesium atomic beam tube, the present invention is applicable to other atomic and molecular resonator systems employing Ramsey-type interrogation techniques, as will be shown.

Fundamentally, an atomic beam frequency standard detects resonance transitions between specific energy states of the atom to obtain a standard frequency, while molecular energy states are employed in molecular resonators. To utilize this resonance, atomic particles, such as cesium atoms, in a beam interact with electromagnetic radiation in such a manner that when the frequency of the applied electromagnetic radiation is at the resonance frequency associated with a change of state in the particular atoms, the atoms in selected atomic states are deflected into a suitable detector. The frequency of the applied radiation is modulated about the precise atomic resonance frequency to produce a signal from the detector circuitry suitable for the servo control of a flywheel oscillator. Control circuitry is thus employed to lock the center frequency of the applied radiation to the atomic resonance line. In molecular resonators, such control circuitry locks onto the molecular resonance line.

When cesium atoms are employed in an atomic beam tube, the particular resonance of interest is that of the transition between two hyperfine levels resulting from the interaction between the nuclear magnetic dipole and the spin magnetic dipole of the valence electron. Only two stable configurations of the cesium atom exist in nature, in which the dipoles are either parallel or anti-parallel, corresponding to two allowed quantum states. Thus, in the absence of an external magnetic field, there are two hyperfine energy levels, each of which may be split by an external magnetic field into a number of Zeeman sublevels.

To cause a transition from one state to the other, an amount of energy E equal to the difference in energy of orientation must be either given to or taken from the atom. Since all cesium atoms are identical, E is the same for every atom. The frequency f of the electromagnetic energy required to cause a change of state is given by the equation $E=hf$, where h is Planck's constant. For cesium, the magnitude of f is approximately 9,192.631770 megahertz.

A conventional cesium atomic beam apparatus provides a source from which cesium evaporates through a collimator which forms the vapor into a narrow beam and directs it through the beam tube.

This collimated beam of atoms is acted upon by a first state selecting magnet or "A" magnet, which provides a strongly inhomogeneous magnetic field. The direction of the force experienced by a cesium atom in such a field depends on the state of the atom. In this field, the energy states $F=3$ and $F=4$ are split up into sublevels. All of the atoms of the $F=4$ state, except those for which $m_F= -4$, are deflected in one direction, and all other atoms are deflected in the other direction.

Upon emergence from the A-field, those atoms enter a central region where they are subjected to a weak uniform C-field to assure the separation in energy of the $m_F=0$ states from the nearby states for which $m_F \neq 0$. This small magnetic field also serves to establish the spatial orientation of the selected cesium atoms and, therefore, the required direction of the microwave magnetic field.

While in this uniform weak field region, the cesium beam is subjected to an oscillating externally generated field of approximately the resonance frequency required to cause transitions from the (3,0) to the (4,0) sublevel.

After leaving this energy transfer region, the beam is acted on by a second state-selecting magnet, similar to the A-magnet, producing a strong inhomogeneous field. Here the atoms of all the $F=3$ groups (and also those of the $(4,-4)$ sublevel) are discarded. The only undiscarded atoms are those of the (4,0) sublevel, which exist at this point only because of the induced transition described above. These atoms are allowed to proceed toward a detector of any suitable type, preferably of the hot-wire ionizer mass spectrometer type.

The magnitude of the detector current, which is critically dependent upon the closeness to resonance of the applied RF frequency, is used after suitable amplification to drive a servo system to control the frequency of the oscillator/multiplier which produces the applied RF frequency.

Although the above description has been provided for an atomic beam resonator apparatus using cesium, similar systems are found in molecular beam resonator apparatus, as is known to those skilled in the art. The Ramsey type interrogation technique may also be realized in atomic and molecular resonators by application of a time delayed coherent pulse technique, rather than utilizing a beam technique.

One critical factor in both atomic and molecular resonators is the provision of the externally generated field having a frequency equal to that of the resonance frequency. In determining the resonance frequency a servo system is employed which locks onto a peak output of the beam tube, it being assumed that the peak output is approximately the resonance frequency of cesium.

Although, this specification makes reference to peaks and valleys, it should be understood that peaks are referring to maximum positive amplitudes and valleys to maximum negative amplitudes. For both atomic and molecular resonators, the response curve of FIG. 2 shows the response about a given center frequency. The response curve can be normalized about a zero reference level, so that there will be positive and negative "peaks". It is in this sense that the term peak is meant to denote a maximum, positive or negative amplitude.

It has been determined that the resonator produces a harmonic like response in which there are several peaks each spaced from the other, while there is only one maximum peak at the true resonant frequency of 9.19263177 GHz for cesium. The frequency will be different for each type molecular or atomic resonator employed. Since the frequency ranges are of such high order, it has been difficult to accurately locate the true peak during critical times. Such times occur when the standard is first started, such as when first being turned on, or when being restarted after an interruption of operation. Also, there are times when the operator must work with the resonator which also requires restarting of the apparatus. Still additionally, resonator components are replaced which causes shifts in the resonator. Even further resonators employed in frequency standards must be replaced, and readjustment of the instrument electronics must take place.

Generally, the feedback system employed to stabilize the interrogating frequency signal has locked on to one of the peaks, and the operator may attempt to finely tune the apparatus to have the feedback circuit lock on the highest peak. This work is tedious, time consuming, unreliable and generally most custom tuning is inaccurate since there has been no prior art system for ensuring that the locked-on peak is that of maximum amplitude.

Additionally, it is necessary to perform the tuning and selection more than once from the resonator's initial testing and validation to its final assembly into a complete instrument. Instrumentation for the selection process is quite complicated, difficult to use and often unreliable.

An object of this invention is to provide a system to identify the maximum resonant peak in the response of an atomic and molecular resonator.

Another object of this invention is to provide such a system which is quick, efficient, reliable, automatic and capable of being easily used.

Still another object of this invention is to provide such a system which is capable of being produced as a small modular assembly capable of being effectively operated and attached to a respective resonator so as to always be used for the same resonator during the selection process. Additionally, such a modular assembly may be used with comparable replacement resonators without adjustment of system parameters.

Other objects, advantages and features of this invention will become more apparent from the following description.

SUMMARY OF THE INVENTION

In accordance with the principles of the invention, the above objects are accomplished by providing a peak analyzer comprising a high speed microprocessor unit connected to receive the response of an atomic or molecular resonator unit, the peak analyzer including means to analyze a plurality of peak values and to simultaneously control a variable oscillator, the peak analyzer comprising means to analyze each peak value and to compare the analyzed value with prior values to select the maximum peak.

As a further feature of this invention, a microprocessor is employed to assess the symmetry of the resonator response about the selected peak to determine if symmetry conditions are met. Once established, such symmetry testing can confirm the validity of the selection of the maximum peak.

The simultaneously controlled voltage level is ascertained and is used to produce the desired frequency which is synthesized to produce the desired interrogating frequency signal.

DETAILED DESCRIPTION

Figure 1:
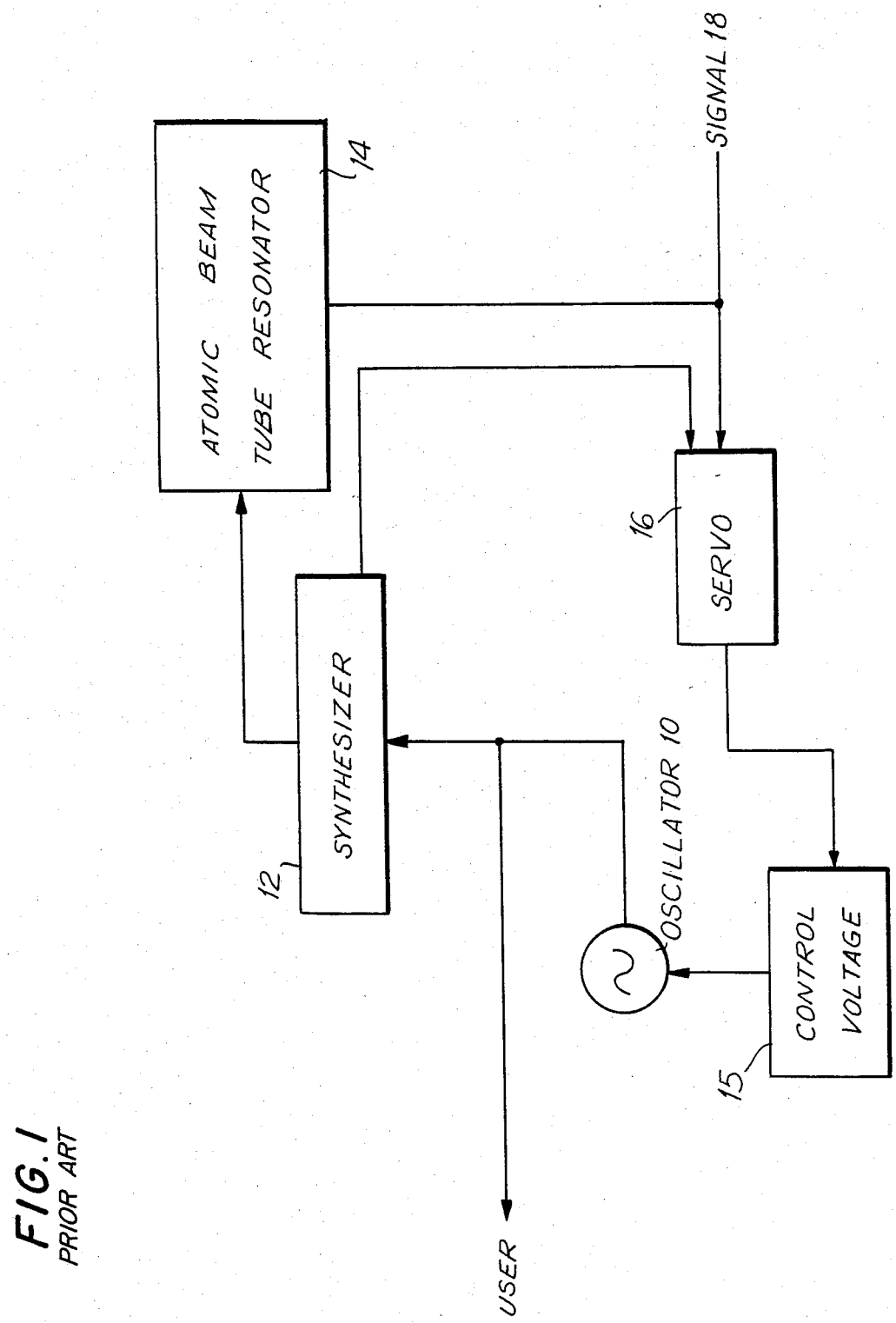
FIG. 1 is a block diagram of an atomic frequency standard.

Although this invention is applicable to both atomic and molecular resonators, for purposes of illustration, an atomic beam resonator is shown. FIG. 1 is a block diagram of an atomic frequency standard. This block diagram is well known in the art and comprises an oscillator 10, often identified as the user oscillator, since its output is used as a standard which is based on the resonance of the atomic beam tube resonator. The output of oscillator 10 is supplied as an input to synthesizer 12, the function of which is to perform several operations on the frequency output of the oscillator to provide the interrogating frequency signal which is applied to an atomic beam tube resonator 14 to produce the resonant responses. The synthesizer operations on the oscillator output may involve frequency multiplication, division, addition and/or subtraction. Conventionally, the user output frequency is of the order of 5 or 10 MHz. The oscillator frequency is controlled by a voltage applied to its control voltage inputs by a control voltage 15.

The output of resonator 14 is applied to a servo system 16 which compares the synthesized signal frequency with the atomic resonator frequency. The servo maintains equality between these two frequencies but will lock onto any peak response. Thus, the present invention is directed to automatically select the maximum peak of the output of the resonator and the servo merely becomes slaved to that selected peak.

Since the basic resonance of the resonator 14 serves as the standard for setting the oscillator frequency, it is important that the selected resonator resonance be exactly 9.19263177 GHz.

Figure 2:
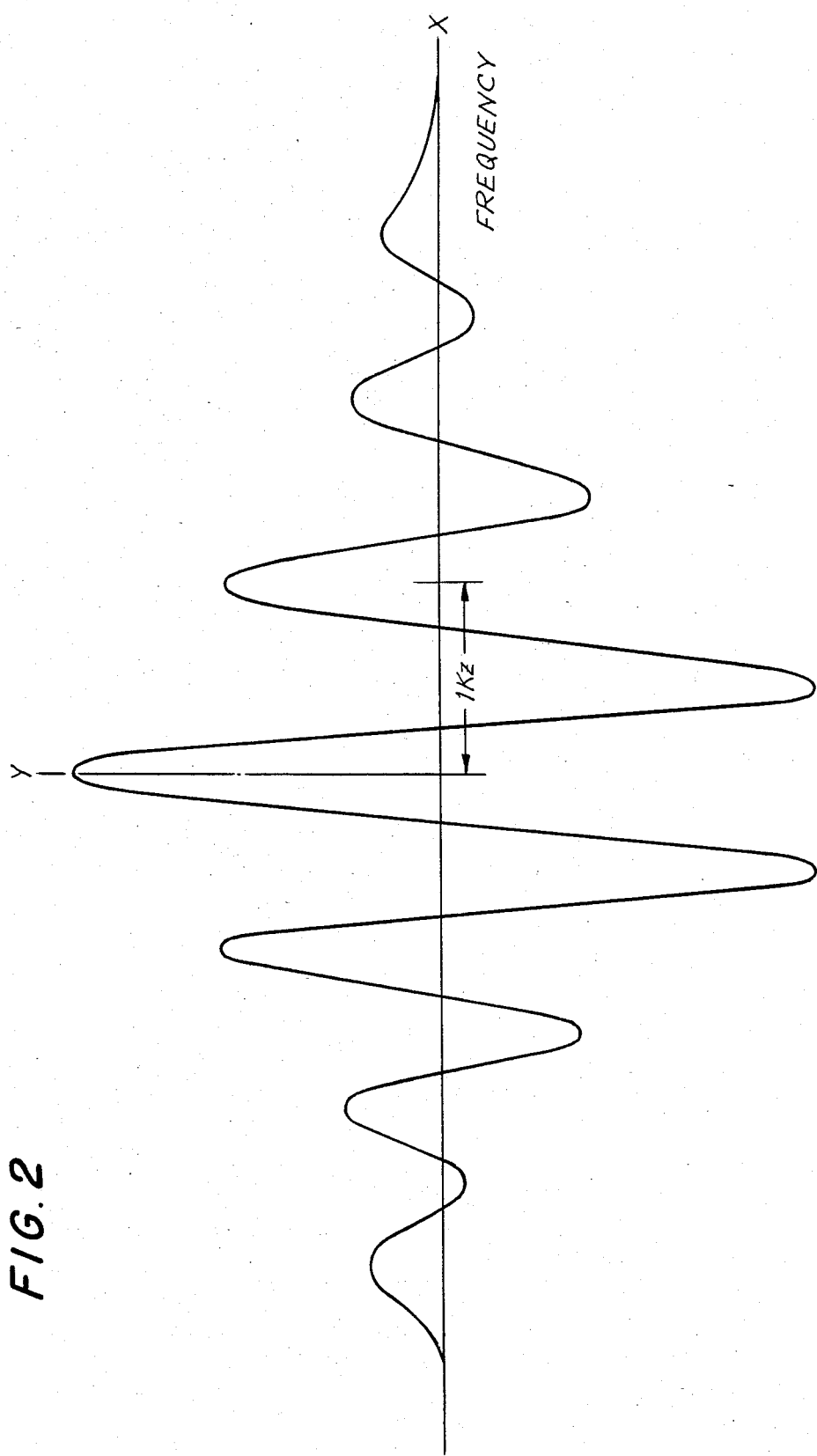
FIG. 2 is the response curve of an atomic beam resonator.

FIG. 2 shows the response of a typical atomic beam tube resonator, and this response also is commonly found present in molecular beam resonators. The response is sinusoidal and formed of a maximum peak value symmetrically surrounded by other peaks and valleys. The amplitudes of the two valleys on either side of the maximum positive peak are substantially equal and greater than the magnitude of the other valleys. The resonator amplitude is plotted along the y axis (vertical) as a function of the applied frequency which is plotted along the x axis (horizontally). The resonance could also appear as the inverted pattern of FIG. 2, and the above statements regarding the application of the term peak are applicable here.

The central peak which is of the greatest magnitude occurs at the desired frequency. The other peaks occur at frequency intervals of approximately 1 KHz away from the center peak. The actual interval separation is dependent upon the dimensions of the beam tube apparatus; intervals of 1 KHz are representative of beam type devices.

Since the GHz frequency range is $10^6$ times greater than the KHz frequency range, it is clear that selection of the one peak of maximum amplitude has been a difficult task. Therefore, in most cases, the servo in FIG. 1 would lock onto one of the peaks shown in FIG. 2, but that peak may not be the maximum. As a consequence, the accuracy of the user frequency may be in question because of the difficulty of locking onto the center frequency peak. Additionally, and as described above, there are many instances where peak selection for atomic beam tube resonators is to be employed, and the inability to reliably select the maximum peak has been a continued hindrance on accuracy.

Figure 3:
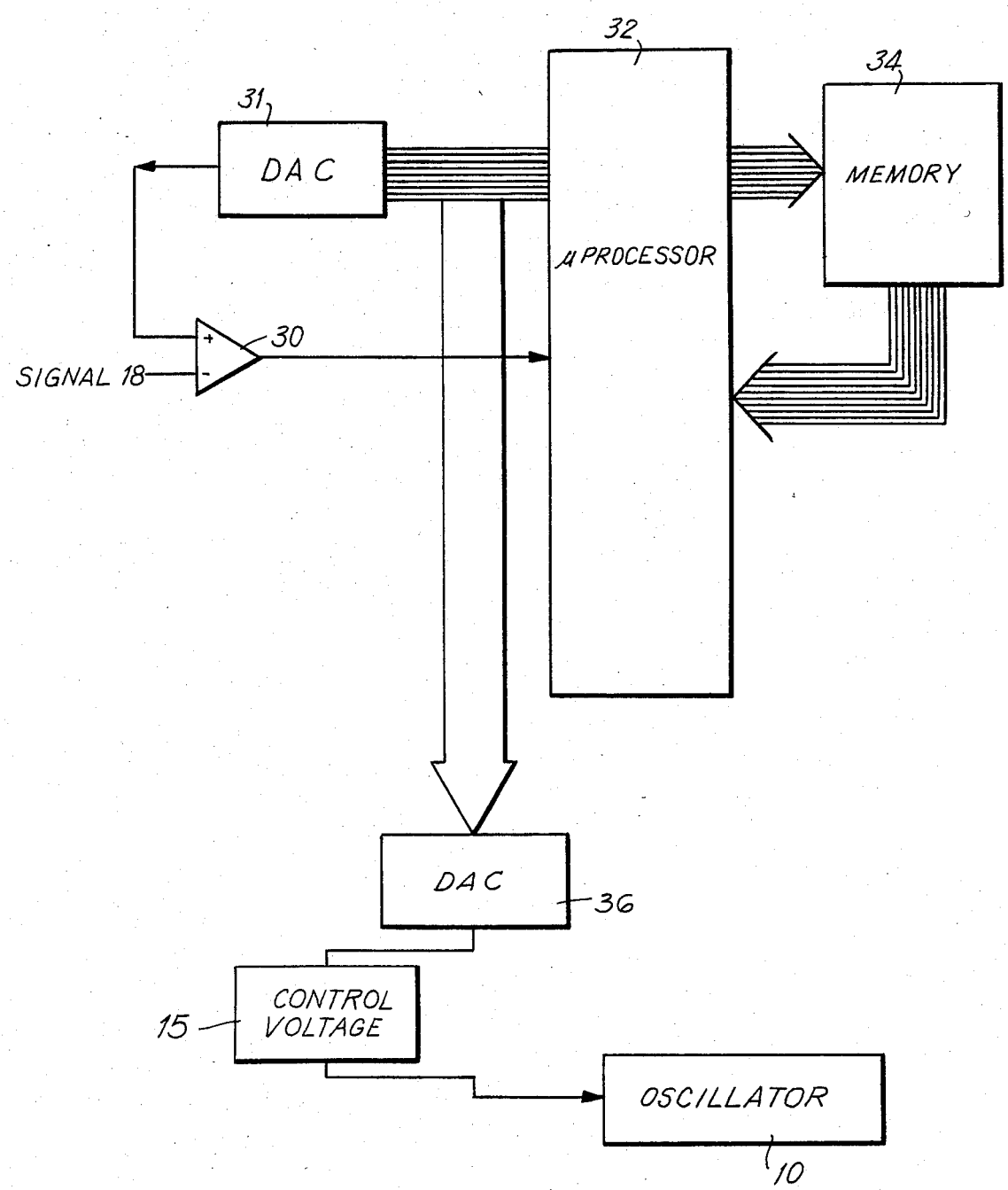
FIG. 3 is a block diagram of a peak analyzer of this invention utilizing a microprocessor.

FIG. 3 is a block diagram of one system employed in the present invention to perform the peak selection automatically and reliably.

Oscillator 10 will be varied over a desired range, which will include the center peak frequency as well as other peak frequencies. The frequency output of oscillator 10 is controlled by varying the voltage applied to the control voltage input of the oscillator. The output of the beam tube resonator 14 (FIG. 1) is applied to a peak analyzer system of FIG. 3.

The system operates to convert the beam tube response to a digital value in an analog to digital converter. Such converter may be a single integrated circuit, such as Analog Devices AD7574, for example. An alternative approach implements the analog to digital conversion as a subroutine within the stored program of the microprocessor memory 34. A frequently used routine is known as successive approximation analog to digital conversion. The routine may be simply described as one of trial and error; a digital trial value is applied by the microprocessor 32 to a digital to analog converter (DAC) 31 (which could be a DAC 1006 manufactured by the National Semiconductor Corp.). The analog value corresponding to this digital trial value is compared to the input signal 18 in two- input comparator 30. The output of the comparator provides to the microprocessor logic an indication of the relative amplitude of the digital trial value with respect to the input signal. If the digital trial value is too large, a smaller trial value is produced and compared. In this fashion, the input signal may be converted to digital form. Additionally, the control voltage applied to the oscillator to produce that response is also stored in digital form (not shown). The oscillator frequency is incrementally changed from one end to the other of its range of variation, and the response of the beam tube is converted from analog to digital form at each step. For purposes of illustration, the oscillator could be incrementally stepped over a range of 10 kHz with 200–300 steps within that range.

Each digital value representing the output of the beam tube resonator is compared with the previously stored value in microprocessor 32. If the new digital value is greater than that previously stored, the new value replaces that previously stored. If the new value is smaller than the stored value, then the stored value is not changed. At each increment the control voltage is also stored in digital form and the digital value is converted to an analog value by D/A converter 36 (DAC) which applies its output to the oscillator to produce a corresponding frequency output. In this way, the digitally stored value applied to DAC 36 can be correlated with the determination of whether or not the newly selected output step of the beam is greater than that previously stored.

As may be readily understood, this step-by-step process employing high speed components enables the analysis of the response of the resonator to be quickly, efficiently and reliably performed. The entire process may be automatically performed with the microprocessor automatically stepping through the 200–300 steps very rapidly. The maximum peak is selected and the corresponding stored digital representation of the control voltage is available for use to control the voltage supply.

As a further feature of this invention, the microprocessor is employed to analyze the symmetry of the sinusoidal curve about the peak selected to be the maximum. The greatest negative value is stored (assuming the peak to be positive) and that value is compared in the manner just described with the next negative peak value following that selected as the maximum peak. The repetitive comparison performed by the apparatus of FIG. 3 for determining the peak value is again employed. If the amplitude of the next negative peak (or valley) following the selected maximum peak (positive) is substantially equal to that previously determined to be the prior maximum negative amplitude, then the measured value for the peak is confirmed because of the symmetry thus sensed. If on the other hand, the negative values are not substantially equal, then that selected as the maximum peak is rejected as invalid and the apparatus to automatically select the maximum positive peak restarts.

As a further embodiment of this invention, this just described symmetry selector may be used to find and identify the peak value without first finding said peak value. Since the symmetry selector finds the two maximum negative valleys, it can be seen from FIG. 2 that the positive peak between those maximum negative valleys will be that at the desired resonance frequency.

One of the other features of this invention is the use of modular components. For example, the microprocessor is an 1802 RCA or Hughes chip, while the D/A converters may be the DAC 1006 manufactured by National Semiconductor. The memory 34 consists of two types: that which serves to store the operational sequence of instructions to the microprocessor or the so called read only memory (ROM) and that which serves to store intermediate numerical data acquired or used by the microprocessor logic. This latter memory type is called a random access memory or RAM. A suitable ROM device may be the 2716 manufactured by Intel Corporation; a suitable RAM device might be the CDP 1824 manufactured by RCA.

With this modular construction which may be mounted on circuit boards, each peak analyzer of this invention may be fabricated for specific resonators and may be assigned to such resonator. Additionally, the peak analyzer may be used when the resonator is replaced and retuning is required. Therefore, the need to perform repeated manual readjustments can be eliminated, and the ability to perform the selection process in the field will be materially enhanced.

Overall, the present invention facilitates assembly of the frequency standard, in house testing and field maintenance. The selection procedure would normally be applied after a short settling period following start up of the resonator, but in view of the simplicity and ease of use of the peak analyzer, it may also be used during normal resonator operation to guard against drift which could occur.

The present invention has been described with reference to a Cesium Beam Tube, but the invention is equally applicable to any other atomic resonators using a Ramsey type interrogation technique. This technique is applicable to beam type as well as delayed coherent pulse interrogation applications. Further, the invention is also applicable to selection of the peak in molecular resonators used in frequency standards.

What is claimed is:

1. A system to find and identify the desired resonant peak in the response of a resonator used for frequency standards, said system comprising, a voltage controlled oscillator connected to a synthesizer, a voltage applied to said voltage controlled oscillator to control the oscillator frequency, said synthesizer producing a frequency which is applied to said resonator to produce a resonator response, a peak analyzer receiving the output of said resonator, said peak analyzer comprising means to simultaneously store the amplitude of the voltage applied to said voltage controlled oscillator and the amplitude of the corresponding resonator output, means to compare the amplitudes of successively generated and stored resonator outputs and to select the resonator output having the maximum peak value.

2. The system of claim 1, wherein said means to store the amplitude of the voltage applied to said voltage controlled oscillator comprises means to select the stored voltage amplitude corresponding to the resonator output having the maximum peak.

3. The system of claim 1, wherein said voltage controlled oscillator and said synthesizer are variable over a predetermined frequency range, said system further comprising means to discretely step the output of said synthesizer across said range.

4. The system of claim 3, wherein said variable frequency range is approximately 10 kHz and the number of discrete steps through said range is at least 200.

5. The system of claim 3, wherein said means to discretely step said synthesizer across said range is automatic, said system performing the selection of the resonator output having the maximum value by selecting one of said discrete steps.

6. The system of claim 5, wherein said system comprises means to convert each resonator response at each discrete step to a digital value, storage means for storing the digital value corresponding to the resonator output having the maximum peak output, comparison means for comparing the digital value at each said resonator response with that stored corresponding to the prior maximum resonator response, and means to change the value stored in said storage means when the digital value compared is greater than that in said storage means.

7. The system of claim 6, further comprising means to convert said digital value to an analog signal applied to said voltage controlled oscillator.

8. The system of claim 1, wherein said resonator comprises a cesium beam tube and the frequency generated when said resonator output is at maximum peak value is equal to 9.19263177 GHz.

9. The system of claim 1, wherein said system is fabricated of modular electronic elements of integrated circuitry design and a circuit board to which said elements are connected, said circuit board capable of being attached to a resonator so as to be carried therewith whereby field maintenance is enhanced.

10. The system of claim 1, wherein said resonator comprises a resonator using a Ramsey type interrogation technique.

11. The system of claim 10, wherein said resonator is a beam type resonator.

12. The system of claim 10, wherein said resonator is a time delayed coherent pulse type resonator.

13. The system of claim 1, wherein said resonator comprises a molecular resonator.

14. The system of claim 1, wherein said resonator comprises an atomic resonator.

15. The system of claims 2 or 3, wherein said means to compare comprises means to store the maximum negative peak value and to compare the amplitudes of the negative peaks next preceding and next following the resonator output having the maximum peak positive, said means to compare providing a measuring of the symmetry of said response of said resonator, whereby if the amplitudes of said negative peaks are substantially equal, the selection of the greatest positive peak is confirmed.

16. The system of claim 1, wherein said means to compare and to select the resonator output having the maximum peak comprises means to convert each resonator response to a digital value, storage means for storing the digital value corresponding to the amplitude having a maximum peak of one polarity, said storage means storing the value of the next maximum peak of the opposite polarity following the said maximum peak of said one polarity, said storage means storing the digital value corresponding to the magnitude of the next successive maximum peak of said one polarity, comparison means to compare the digital values of the successive maximum peaks of said one polarity, and means to select said peak of said opposite polarity when said comparison means senses that said digital values are substantially equal.

* * * * *